(12) United States Patent
Imura

(10) Patent No.: US 6,597,121 B2
(45) Date of Patent: Jul. 22, 2003

(54) ACTIVE MATRIX ORGANIC EL DISPLAY DEVICE AND METHOD OF FORMING THE SAME

(75) Inventor: Hironori Imura, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/984,303

(22) Filed: Oct. 29, 2001

(65) Prior Publication Data

US 2002/0050795 A1 May 2, 2002

(30) Foreign Application Priority Data

Oct. 27, 2000 (JP) ........................................ 2000-328098

(51) Int. Cl.[7] .............................. G09G 3/10; H01J 63/04
(52) U.S. Cl. ..................................... 315/169.3; 313/500
(58) Field of Search ........................... 315/169.3, 169.4; 313/500, 505, 400, 492; 345/36, 45, 76; G09G 3/10; H01J 63/04

(56) References Cited

U.S. PATENT DOCUMENTS

| | | | | |
|---|---|---|---|---|
| 6,072,450 A | * | 6/2000 | Yamada et al. | ........... 345/76 |
| 6,175,345 B1 | * | 1/2001 | Kuribayashi et al. | ........ 280/287 |
| 6,246,179 B1 | * | 6/2001 | Yamada | .................... 315/169.3 |
| 6,259,200 B1 | * | 7/2001 | Morita et al. | ................ 313/498 |
| 6,326,726 B1 | * | 12/2001 | Mizutani et al. | ............. 313/504 |
| 6,333,603 B1 | * | 12/2001 | Juang et al. | .............. 315/169.3 |
| 6,340,962 B1 | * | 1/2002 | Konishi | ...................... 345/75.2 |
| 6,373,453 B1 | * | 4/2002 | Yudasaka | ...................... 345/76 |

* cited by examiner

*Primary Examiner*—Don Wong
*Assistant Examiner*—Trinh Vo Dinh
(74) *Attorney, Agent, or Firm*—Young & Thompson

(57) ABSTRACT

The present invention provides an active matrix organic electroluminescence display device including: a transparent substrate; a plurality of pixels aligned over the transparent substrate, wherein each of the pixels further includes: a luminescent region which exhibits a luminescence upon application of an electric field; a circuitry region including at least a circuitry; and an optical shielding structure provided between the luminescent region and the circuitry region for shielding the circuitry region from the luminescence from the luminescent region.

35 Claims, 11 Drawing Sheets

ACTIVE MATRIX ORGANIC EL DISPLAY DEVICE AND METHOD OF FORMING THE SAME

BACKGROUND OF THE INVENTION

1. Field of the Invention

The present invention relates to an active matrix organic electroluminescence display device and a method of forming the same, and more particularly to an improvement in a pixel structure of the active matrix organic electroluminescence display device and a method of forming the pixel structure.

2. Description of the Related Art

The active matrix organic electroluminescence display device has an array of pixels, each of which includes a circuitry region and an electroluminescence region which exhibits a luminescence upon application of an electric filed. The circuitry region may often include a thin film transistor having a polysilicon layer.

One of the conventional active matrix organic electroluminescence display device is disclosed in Japanese laid-open patent publication No. 2000-172198. FIG. 1A is a fragmentary plan view illustrative of a single pixel structure of the conventional active matrix organic electroluminescence display device. FIG. 1B is a fragmentary cross sectional elevation view illustrative of a single pixel structure of the conventional active matrix organic electroluminescence display device.

The conventional active matrix organic electroluminescence display device exhibits a luminescence upon application of an electric field to a luminescence region 5. The luminescence is represented by arrow marks. The luminescence may be scattered in a substrate 9, a gate oxide film 13, an inter-layer insulator 15 and on interfaces between them. The scattered light is a stray light which may be incident into a polysilicon layer 12 of a thin film transistor. Further, the luminescence light may be reflected by the substrate 9 so that the reflected light may be a stray light which is incident into the polysilicon layer 12 of the thin film transistor.

The incidence of the stray lights into the polysilicon layer 12 causes the increase in leakage of current of the thin film transistor and the transistor shows a malfunction, whereby a display defect or a display contrast reduction may be caused. This problem becomes more serious as the display gradation becomes large. If the circuitry includes a capacitor and the stray light is incident into a capacitive dielectric layer of the capacitor, then the capacitor becomes unable to hold charges.

It, is therefore, desirable to provide an optical shielding structure which shields the circuitry such as the thin film transistor or the capacitor from the stray light from the luminescence.

The conventional structure shown in FIG. 1B has a planarized insulating layer 25 which may absorb a stray light. The luminescence is, however, omnidirectional. Thus, a part of the luminescence is a light transmitted in a horizontal direction. Such horizontally transmitted light may easily be incident into the polysilicon layer 12.

Other conventional techniques for shielding the thin film transistor from the stray light are disclosed in Japanese laid-open patent publications Nos. 9-80476, 11-84363 and 2000-164875. FIG. 2 is a fragmentary cross sectional elevation view of a pixel structure of the conventional active matrix organic electroluminescence display device, which is disclosed in Japanese laid-open patent publication No. 2000-164875. An optical shield film 26a is provided under the thin film transistor. This conventional optical shielding structure allows an incident of a stray light in a horizontal direction into the polysilicon layer 12 of the thin film transistor.

FIG. 3 is a fragmentary cross sectional elevation view of a pixel structure of the conventional active matrix organic electroluminescence display device, which is disclosed in Japanese laid-open patent publication No. 9-80476. Top and bottom optical shielding layers are provided over and under the thin film transistor. This conventional optical shielding structure allows an incident of a stray light in a horizontal direction into the polysilicon layer 12 of the thin film transistor.

The above conventional optical shielding structures are unable to shield the circuitry such as the thin film transistor from the stray light particularly transmitted in the horizontal direction.

In the above circumstances, the development of a novel active matrix organic electroluminescence display device free from the above problems is desirable.

SUMMARY OF THE INVENTION

Accordingly, it is an object of the present invention to provide a novel active matrix organic electroluminescence displayed device free from the above problems.

It is a further object of the present invention to provide a novel pixel structure of an active matrix organic electroluminescence display device free from the above problems.

It is a still further object of the present invention to provide a novel method of forming an active matrix organic electroluminescence display device free from the above problems.

It is yet a further object of the present invention to provide a novel method of forming a structure of an active matrix organic electroluminescence display device free from the above problems.

The present invention provides an active matrix organic electroluminescence display device including: a transparent substrate; a plurality of pixels aligned over the transparent substrate, wherein each of the pixels further includes: a luminescent region which exhibits a luminescence upon application of an electric field; a circuitry region including at least a circuitry; and an optical shielding structure provided between the luminescent region and the circuitry region for shielding the circuitry region from the luminescence from the luminescent region.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DETAILED DESCRIPTION OF THE PREFERRED EMBODIMENTS

Figure 1A:
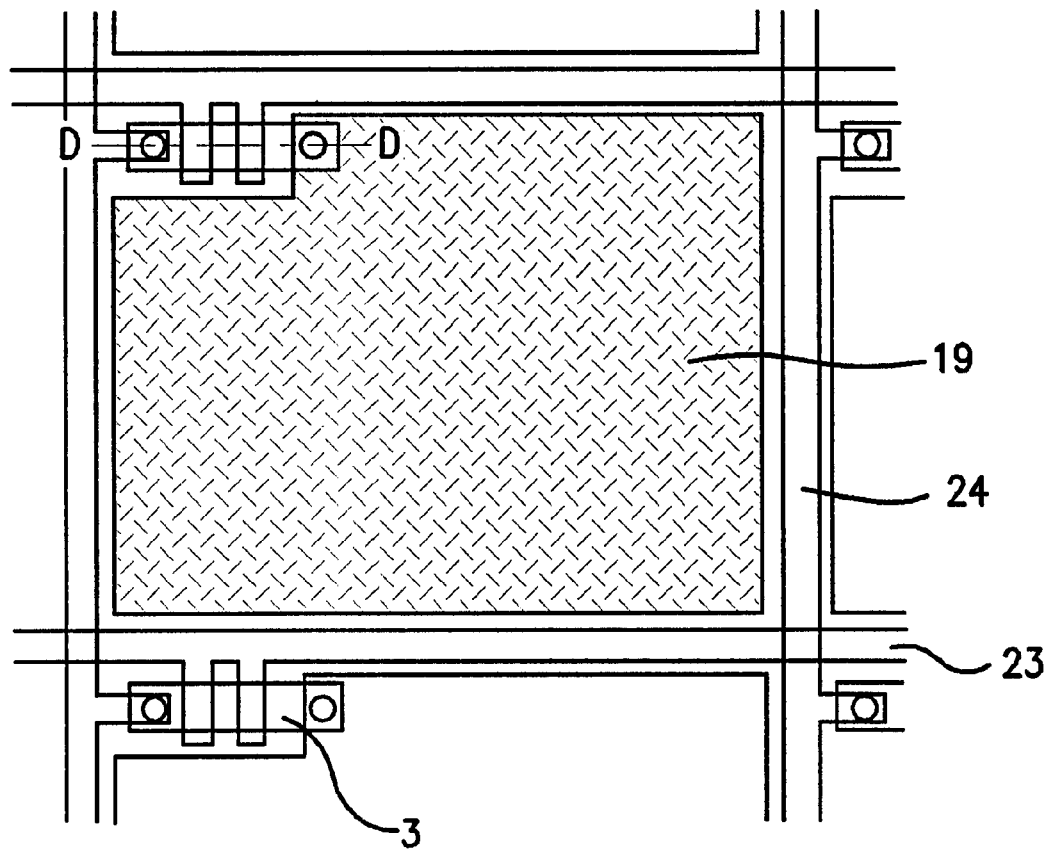
FIG. 1A is a fragmentary plan view illustrative of a single pixel structure of the conventional active matrix organic electroluminescence display device.
Figure 1B:
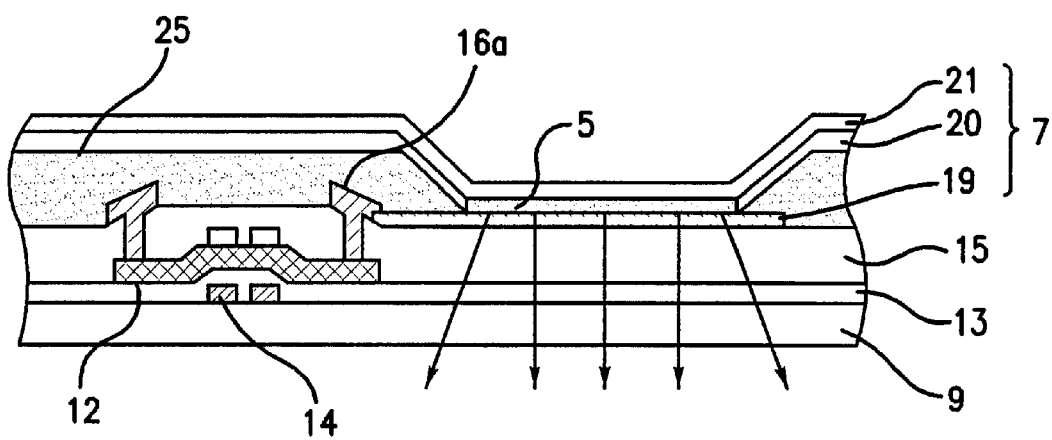
FIG. 1B is a fragmentary cross sectional elevation view illustrative of a single pixel structure of the conventional active matrix organic electroluminescence display device.
Figure 2:
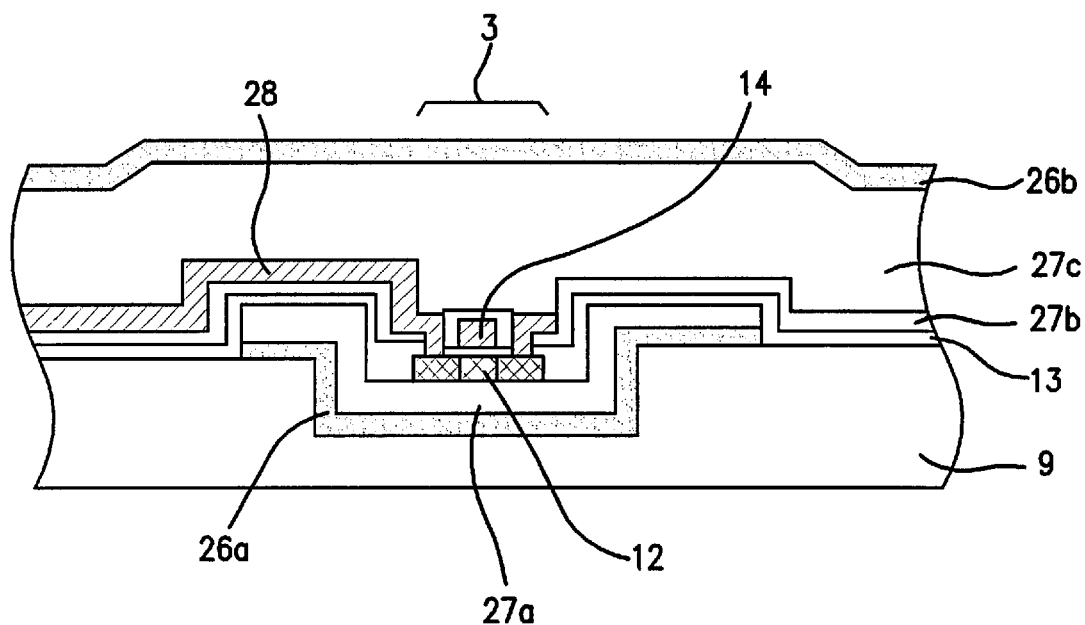
FIG. 2 is a fragmentary cross sectional elevation view of a pixel structure of the conventional active matrix organic electroluminescence display device.
Figure 3:
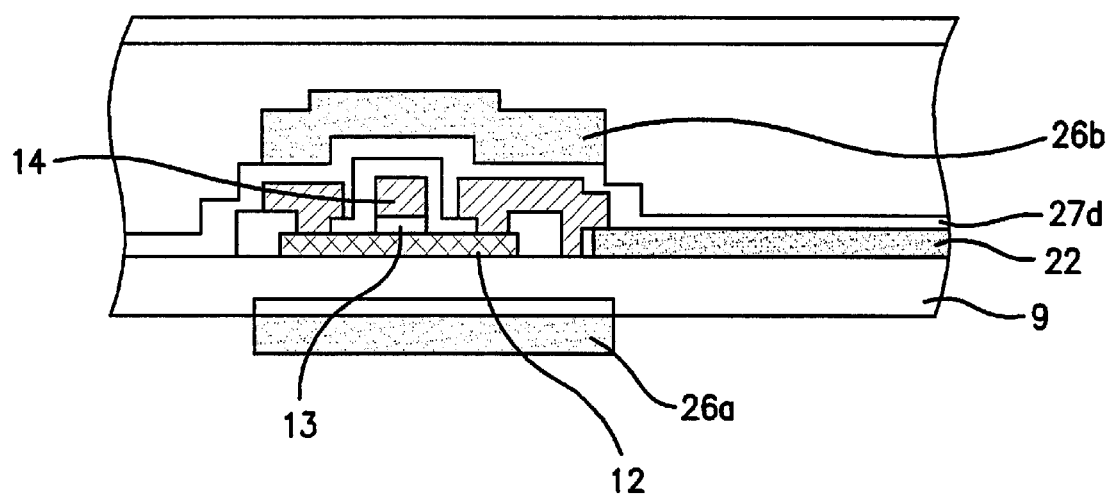
FIG. 3 is a fragmentary cross sectional elevation view of a pixel structure of the conventional active matrix organic electroluminescence display device.

A first aspect of the present invention is a pixel structure of an electroluminescence display device. The structure includes: a luminescent region which exhibits a luminescence upon application of an electric field; a circuitry region including at least a circuitry; and an optical shielding structure provided between the luminescent region and the circuitry region for shielding the circuitry region from the luminescence from the luminescent region.

It is preferable that the optical shielding structure includes a shielding wall which vertically extends from a lower level than a circuitry of the circuitry region to a higher level than the circuitry.

It is further preferable that the optical shielding structure further includes a shielding layer which horizontally extends under the circuitry region.

It is further more preferable that the shielding wall vertically extends from a part of an upper surface of the optical shielding structure, and a bottom of the shielding wall is in contact with the part of the upper surface of the optical shielding structure.

It is also preferable that the shielding wall completely surrounds the luminescent region in a plan view.

It is also preferable that the shielding wall completely surrounds the luminescent region in a plan view.

It is also preferable that the shielding wall partially surrounds the circuitry in a plan view.

It is also preferable that the shielding wall completely surrounds the circuitry in a plan view.

It is also preferable that the shielding wall has a top level which is substantially the same as a wiring layer which is electrically connected to the circuitry.

It is also preferable that the shielding wall has a top level which is lower than an anode layer of the luminescent region.

It is also preferable that the shielding wall has a top level which is higher than an anode layer of the luminescent region, and a bottom level which is lower than the anode layer.

It is also preferable that the shielding wall is made of a same material as a wiring layer which is electrically connected to the circuitry.

It is also preferable that the circuitry comprises a thin film transistor.

A second aspect of the present invention is an active matrix organic electroluminescence display device including: a transparent substrate; a plurality of pixels aligned over the transparent substrate. Each of the pixels further includes: a luminescent region which exhibits a luminescence upon application of an electric field; a circuitry region including at least a circuitry; and an optical shielding structure provided between the luminescent region and the circuitry region for shielding the circuitry region from the luminescence from the luminescent region.

It is preferable that the optical shielding structure includes a shielding wall which vertically extends from a lower level than a circuitry of the circuitry region to a higher level than the circuitry.

It is further preferable that the optical shielding structure further includes a shielding layer which horizontally extends under the circuitry region.

It is further more preferable that the shielding wall vertically extends from a part of an upper surface of the optical shielding structure, and a bottom of the shielding wall is in contact with the part of the upper surface of the optical shielding structure.

It is moreover preferable that the shielding wall partially surrounds the luminescent region in a plan view.

It is also preferable that the shielding wall completely surrounds the luminescent region in a plan view.

It is also preferable that the shielding wall partially surrounds the circuitry in a plan view.

It is also preferable that the shielding wall completely surrounds the circuitry in a plan view.

It is also preferable that the shielding wall has a top level which is substantially the same as a wiring layer which is electrically connected to the circuitry.

It is also preferable that the shielding wall has a top level which is lower than an anode layer of the luminescent region.

It is also preferable that the shielding wall has a top level which is higher than an anode layer of the luminescent region, and a bottom level which is lower than the anode layer.

It is also preferable that the shielding wall is made of a same material as a wiring layer which is electrically connected to the circuitry.

It is also preferable that the circuitry comprises a thin film transistor.

A third aspect of the present invention is a method of forming an optical shielding structure between a luminescent region and a circuitry region in a pixel of an electroluminescence display device for shielding the circuitry region from a luminescence from the luminescent region. The method comprises the steps of: selectively forming an optical shielding layer over a substrate on the circuitry region; forming a first insulating layer over the optical shielding layer and the substrate; forming a circuitry over the first insulating layer on the circuitry region; forming a second insulating layer over the circuitry and the first insulating layer; forming at least a first contact hole, which penetrates the second insulating layer and reaches a part of the circuitry, and at least a second contact hole, which penetrates the first and second insulating layers and reaches a part of the optical shielding layer; selectively forming at least a wiring layer electrically connected through the at least first contact hole to the circuitry and also at least an optical shielding wall within the at least second contact hole, wherein the optical shielding wall is in contact with the optical shielding layer.

It is also preferable that the sixth step of further comprising the steps of: depositing an electrically conductive and optically shielding material over the second insulating layer and also within the at least first contact hole and the at least second contact hole; and selectively removing the electrically conductive and optically shielding material to form at least a wiring layer electrically connected to the circuitry and also at least a optical shielding wall in contact with the optical shielding layer.

It is also preferable that the at least second contact hole partially surrounds the luminescent region in a plan view.

It is also preferable that the at least second contact hole completely surrounds the luminescent region in a plan view.

It is also preferable that the at least second contact hole partially surrounds the circuitry in a plan view.

It is also preferable that the at least second contact hole completely surrounds the circuitry in a plan view.

A fourth aspect of the present invention is a method of forming an optical shielding structure between a luminescent region and a circuitry region in a pixel of an electroluminescence display device for shielding the circuitry region from a luminescence from the luminescent region. The method comprises the steps of: selectively forming an optical shielding layer over a substrate on the circuitry region; forming a first insulating layer over the optical shielding layer and the substrate; forming a circuitry over the first insulating layer on the circuitry region; forming a second insulating layer over the circuitry and the first insulating layer; forming at least a first contact hole, which penetrates the first and second insulating layers and reaches a part of the optical shielding layer; selectively forming at least an optical shielding wall within the at least first contact hole, wherein the optical shielding wall is in contact with the optical shielding layer; forming a third insulating layer over the at least optical shielding wall and the second insulating layer; forming at least a second contact hole, which penetrates the second and third insulating layer and reaches a part of the circuitry; and selectively forming at least a wiring layer electrically connected through the at least second contact hole to the circuitry.

It is also preferable that the at least first contact hole partially surrounds the luminescent region in a plan view.

It is also preferable that the at least first contact hole completely surrounds the luminescent region in a plan view.

It is also preferable that the at least first contact hole partially surrounds the circuitry in a plan view.

It is also preferable that the at least first contact hole completely surrounds the circuitry in a plan view.

FIRST EMBODIMENT

Figure 4:
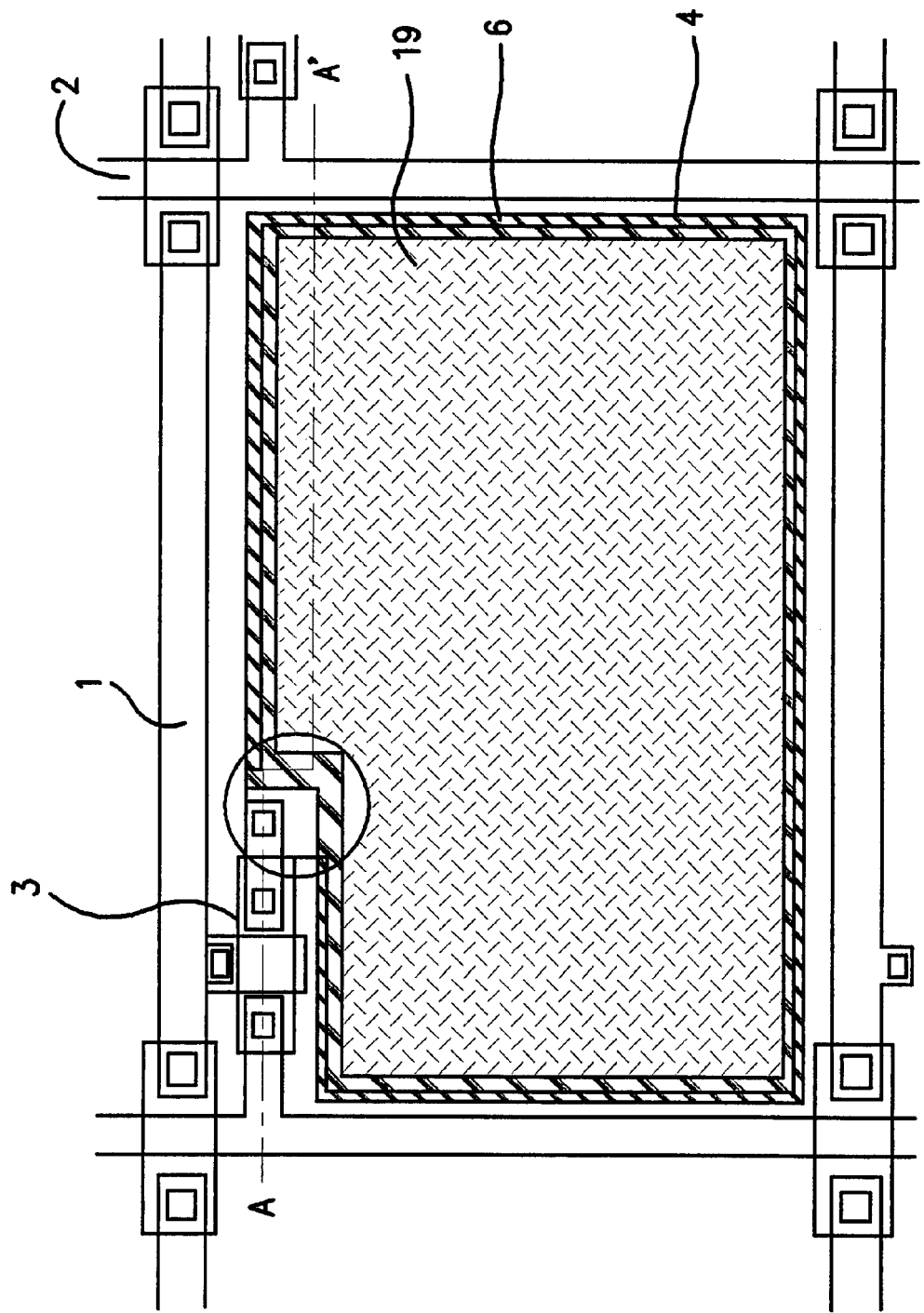
FIG. 4 is a fragmentary plan view of a single pixel of an active matrix organic electroluminescence display device in a first embodiment in accordance with the present invention.
Figure 5:
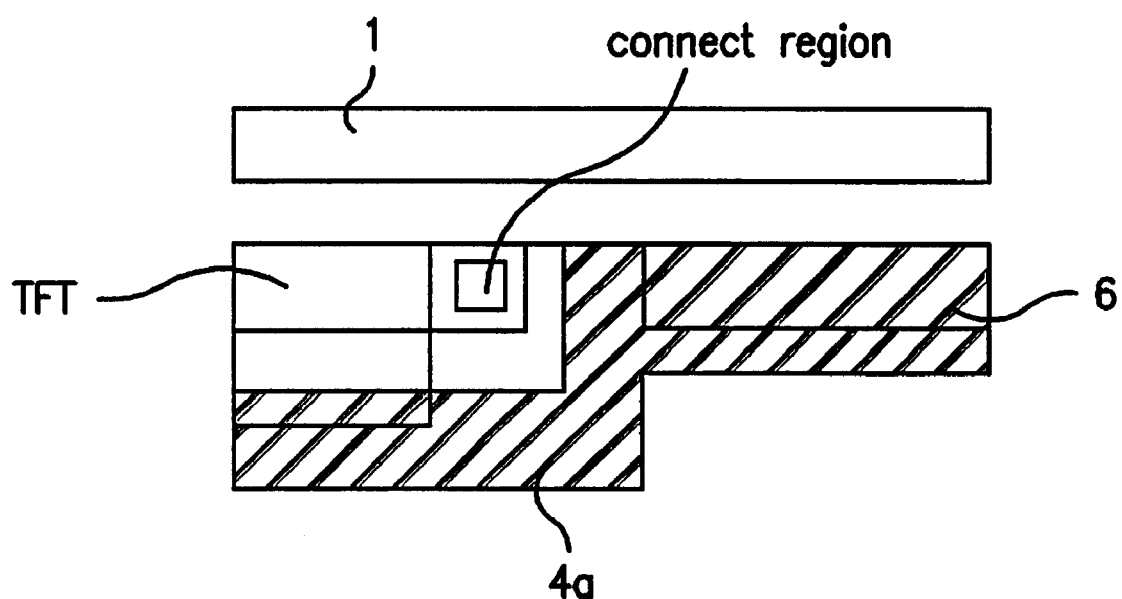
FIG. 5 is a fragmentary enlarged plan view illustrative of a connecting portion between a thin film transistor and an indium tin oxide film in each pixel of FIG. 4.
Figure 6:
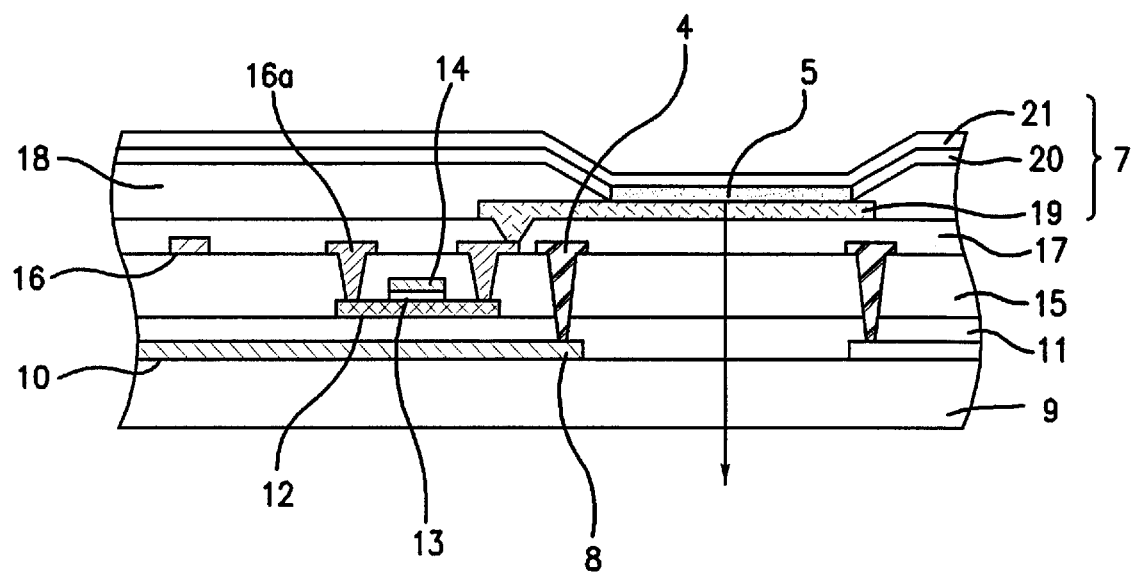
FIG. 6 is a fragmentary cross sectional elevation view illustrative of a single pixel of an active matrix organic electroluminescence display device, taken along a A–A' line of FIG. 4.

A first embodiment according to the present invention will be described in detail with reference to the drawings. FIG. 4 is a fragmentary plan view of a single pixel of an active matrix organic electroluminescence display device in a first embodiment in accordance with the present invention. FIG. 5 is a fragmentary enlarged plan view illustrative of a connecting portion between a thin film transistor and an indium tin oxide film in each pixel of FIG. 4. FIG. 6 is a fragmentary cross sectional elevation view illustrative of a single pixel of an active matrix organic electroluminescence display device, taken along a A–A' line of FIG. 4.

Each pixel is defined by row wirings 1 and column wirings 2. The pixel includes a circuit region and an organic EL device 7. The circuit region includes a thin film transistor 3 and a capacitor if any. A gate electrode 14 of the thin film transistor 3 is connected to the row wiring 1. One of source/drain terminals of the thin film transistor 3 is connected to the column wiring 2. Another of the source/drain terminals of the thin film transistor 3 is connected to an anode 19 of the organic EL device 7. A shielding wall 4 is provided along a circumference of a luminescence region 5, so that the shielding wall 4 encompasses the luminescence region 5.

The active matrix organic EL display device may be fabricated as follows. A transparent substrate 9 is prepared. A shielding layer made of a shielding material such as WSi or a metal with a thickness of about 200 nanometers is deposited by a sputtering method over the transparent substrate 9. A resist pattern is then formed over the shielding layer by use of a lithography technique. The shielding layer is then selectively etched by using the resist pattern as a mask, thereby to form a bottom shielding layer 10 over the transparent substrate 9.

An insulating film 11 such as a silicon oxide film having a thickness of about 600 nanometers is then deposited by a CVD method over the bottom shielding layer 10 and the transparent substrate 9. An amorphous silicon film having a thickness of about 60 nanometers is then deposited by the CVD method over the insulating film 11. An impurity is the doped into the amorphous silicon film. A heat treatment such as a laser anneal is then carried out to make the amorphous silicon film into a polysilicon film. A resist pattern is then formed by a lithography technique over the insulating film 11. The polysilicon film is selectively etched by using the resist pattern as a mask to form a polysilicon layer 12 over a thin film transistor formation region.

An insulating film and a WSi film with a thickness of about 200 nanometers are sequentially deposited over the polysilicon layer 12. A resist pattern is then formed over the WSi film by a lithography technique. The insulating film and the WSi film are selectively etched by using the resist pattern as a mask, thereby to form a gate insulting film 13 and a gate electrode 14. An impurity is doped into the gate electrode 14 and selected regions of the polysilicon layer 12. As a result, a thin film transistor 3 is formed over the transparent substrate 9.

The drawings illustrates a single thin film transistor. Notwithstanding, it is possible, if any, that a plurality of the thin film transistor 3 and capacitor may also be formed over the transparent substrate 9.

An inter-layer insulator 15 such as a silicon oxide film with a thickness of about 600 nanometers is deposited by a CVD method over the thin film transistor 3 and the insulating film 11. Source/drain contact holes are formed in the inter-layer insulator 15, so that the contact holes are positioned in source/drain contact regions. Further, a shielding layer contact hole is formed in the inter-layer insulator 15 and the insulating film 11, so that shielding layer contact hole is positioned over a peripheral region of the bottom shielding layer 10. The shielding layer contact hole extends, in a plan view, to form a trench groove which surrounds the opening of the bottom shielding layer 10.

An electrically conductive and optically shielding material such as aluminum is deposited at a thickness of about 500 nanometers by a sputtering method, so that the electrically conductive and optically shielding material is filled within the source/drain contact holes and shielding layer contact holes as well as extends over the inter-layer insulator 15. The electrically conductive and optically shielding material as deposited is in contact with the source and drain of the thin film transistor 3 and connecting portions 8 of the bottom shielding layer 10.

A resist pattern is formed by a lithography technique over the electrically conductive and optically shielding material. The electrically conductive and optically shielding material is then selectively etched by using the resist pattern as a mask, thereby to form wirings 16, source and drain contacts 16a and an optically shielding wall 4. The optically shielding wall 4 encompasses the luminescence region 5. The optically shielding wall 4 is connected with the connecting portions 8 of the bottom shielding layer 10, wherein the connecting portions 8 are adjacent to an opening region of the bottom shielding layer 10. The opening region of the bottom shielding layer 10 corresponds to the luminescence region 5.

The optically shielding wall 4 vertically extends and the bottom shielding layer 10 horizontally extends. The optically shielding wall 4 is provided for isolating the thin film transistor 3 from the luminescence region 5. The optically shielding wall 4 is higher than the thin film transistor 3 for shielding the thin film transistor 3 from a stray light which has been transmitted from the organic EL device. The bottom shielding layer 10 extends under the thin film transistor 3 for shielding the thin film transistor 3 from a stray light which has been reflected at an interface of the transparent substrate 9. The combination of the optically shielding wall 4 with the bottom shielding layer 10 forms a three-dimensional optical shielding structure which shields the thin film transistor 3 from any stray lights.

Further, the optically shielding wall 4 is provided along an entirety of the circumference of the luminescence region 5 in order to obtain a high shielding efficiency. It is also possible to modify the optically shielding wall 4, so that the optically shielding wall 4 partially extends along a stray light significant part of the circumference of the luminescence region 5.

A planarized insulating layer 17 comprising laminations of an organic film, a silicon oxide film and a nitride film is then deposited over the wirings 16, the source and drain contacts 16a and the optically shielding wall 4 as well as over the inter-layer insulator 15. A contact hole is formed in the planarized insulating layer 17 so that the contact hole is positioned over a part of the source and drain contacts 16a.

An indium thin oxide film of a thickness of about 150 nanometers is deposited over the planarized insulating layer 17 and also within the contact hole, so that the indium thin oxide film within the contact hole is in contact with the part of the source and drain contacts 16a. A resist pattern is formed over the indium thin oxide film by a lithography technique. The indium thin oxide film is selectively etched by using the resist pattern as a mask, thereby forming an anode 19 on a predetermined region. The anode 19 covers the opening of the bottom shielding layer 10. The anode 19 extends on the luminescence region 5. The anode 19 may be made of an electrically conductive and optically transparent material such as indium thin oxide of SnO2.

A resist layer 18 is formed over the planarized insulating layer 17 and a peripheral region of the anode 19. The resist layer 18 has an opening which is positioned inside the circumference of the anode 19 and also inside of a region defined by the optically shielding wall 4. The opening of the resist layer 18 defines the luminescence region 5. Namely, the optically shielding wall 4 encompasses the opening of the resist layer 18 defining the luminescence region 5. The circumference of the anode 19 encompasses the region defined by the optically shielding wall 4. The optically shielding wall 4 isolates the luminescence region 5 from the thin film transistor 3. The resist layer 18 has a tapered sectioned shape adjacent to the opening, wherein the resist layer 18 gradually decreases in thickness toward the opening.

A luminescence device layered structure 20 is evaporated over the resist layer 18 and over the anode 19 exposed through the opening of the resist layer 18. The luminescence device layered structure 20 comprises laminations of a hole injection layer, a hole transport layer, a luminescent layer and an electron transport layer. Those layers are in the range of thickness from 10 nanometers to 50 nanometers. As a modification, it is possible that the luminescence device layered structure 20 comprises laminations of a hole transport layer, a luminescent layer and an electron transport layer. As another modification, it is also possible that the luminescence device layered structure 20 comprises laminations of a hole transport layer, a luminescent layer, an electron transport layer and an electron injection layer. As still another modification, it is also possible that the luminescence device layered structure 20 comprises a single layered structure of a luminescent layer. If a matrix color display is required, the luminescent layer is different in material for respective pixels.

A cathode 21 is evaporated over the luminescence device layered structure 20. The cathode 21 may have a thickness of about 200 nanometers. Aluminum, magnesium-indium alloy, aluminum-lithium alloy are available of the material of the cathode 21. As a result, the pixel of the organic EL display device is completed.

The active matrix organic EL display device also includes a power and peripheral circuit which are not illustrated in the drawings. The active matrix organic EL displayed device also includes a scaling structure and a supporting structure which are not illustrated in the drawings.

In this embodiment, the wirings 16 serving as the row wirings 1 and the column wirings 2 are provided at a single level, so that the crossing point between the row wirings 1 and the column wirings 2 has a bridge structure which utilizes the WSi layer which has been formed at the same time when the gate electrode has been formed. It is, however, possible as a modification that the row wirings 1 and the column wirings 2 are formed at different levels, wherein the wirings 16 comprise multi-level wirings.

The luminescence device layered structure 20 exhibits a luminescence but only in a region applied with an electric field. The resist layer 18 prevents the luminescence device layered structure 20 from being applied with the electric field. The luminescence device layered structure 20 existing in the opening of the resist layer 18 is sandwiched between the anode 19 and the cathode 21 and applied with the electric field. The luminescence device layered structure 20, existing in the opening of the resist layer 18, exhibits a luminescence. This luminescence is omnidirectional.

As described above, the optically shielding wall 4 is provided for isolating the thin film transistor 3 from the luminescence region 5. The optically shielding wall 4 vertically extends from the same level as the bottom shielding layer 10 to the same level as the wirings 16. Namely, the optically shielding wall 4 vertically extends from a lower level than the bottom of the thin film transistor 3 and a higher level than the top of the thin film transistor 3. Further, the bottom shielding layer 10 extends under the thin film transistor 3. The combination of the optically shielding wall 4 with the bottom shielding layer 10 shields the circuit region including the thin film transistor 3 from any stray lights which have been scattered in the substrate 9, the insulating layer 11 and the inter-layer insulator 15 or reflected by interfaces between them or reflected from the substrate 9. As a result, the circuit including the thin film transistor 3 is free from any malfunction due to the stray light. The active matrix organic EL device is free from any defective display.

In the above embodiment, the optically shielding wall 4 is provided along the entirety of the circumference of the luminescence region 5 in order to obtain a high shielding efficiency. It is also possible to modify the optically shielding wall 4, so that the optically shielding wall 4 partially extends along a stray light significant part of the circumference of the luminescence region 5.

In the above embodiment, the optically shielding wall 4 is aligned to the circumferential line 6 of the anode 19 in consideration of a margin for exposure process, so that the circumferential line 6 of the anode 19 is not out of the optically shielding wall 4, and also a possible larger area of the luminescence region 5 is ensured. The relation in position between the optically shielding wall 4 and the circumferential line 6 of the anode 19 may, however, be optional.

In the above embodiment, the optically shielding wall 4 is formed at the same process for forming the source and drain contacts 16a and the wirings 16, provided that the optically shielding wall 4 is made of the same material as the source and drain contacts 16a and the wirings 16. No additional process is needed for forming the optically shielding wall 4.

It is, however, possible as a modification that the optically shielding wall 4 is made of a different optically shielding material from the source and drain contacts 16a and the wirings 16. Metals or organic materials having optically shielding functions may be available for the optically shielding wall 4. Organic materials containing coloring materials are available.

The sectional shape of the optically shielding wall 4 is illustrated as becoming narrower downwardly because the shielding layer contact hole is slightly tapered downwardly due to etching conditions. The tapered sectional shape of the optically shielding wall 4 is thus optional, provided that the narrowest portion of the optically shielding wall 4 is sufficient for shielding the stray light.

SECOND EMBODIMENT

Figure 7:
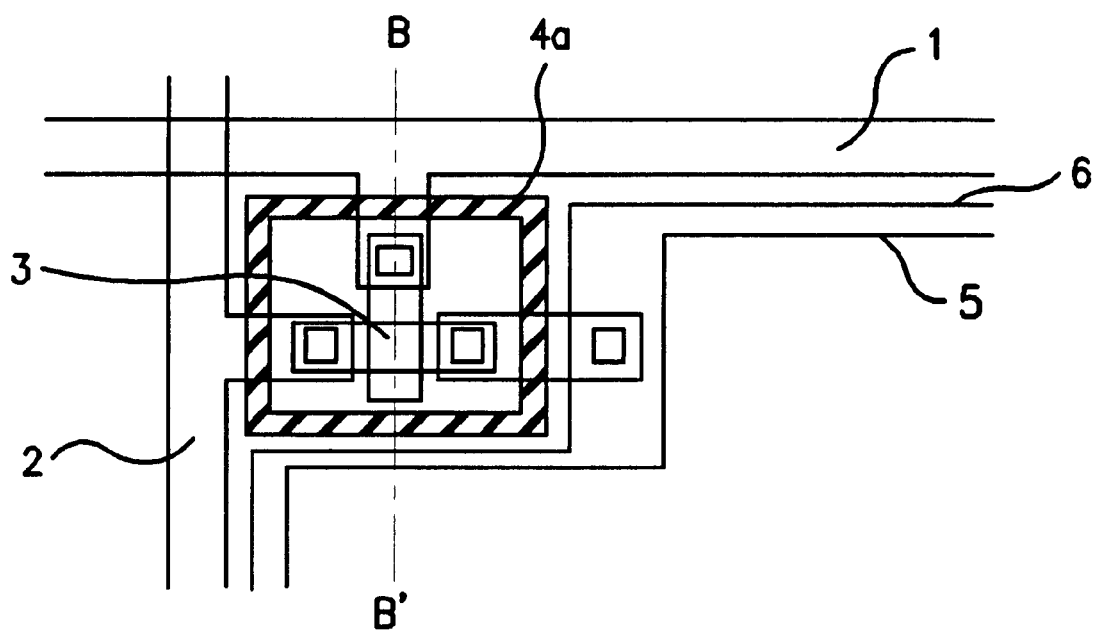
FIG. 7 is a fragmentary enlarged plan view illustrative of a connecting portion between a thin film transistor and an indium tin oxide film in each pixel of an active matrix organic electroluminescence display device in a second embodiment in accordance with the present invention.
Figure 8:
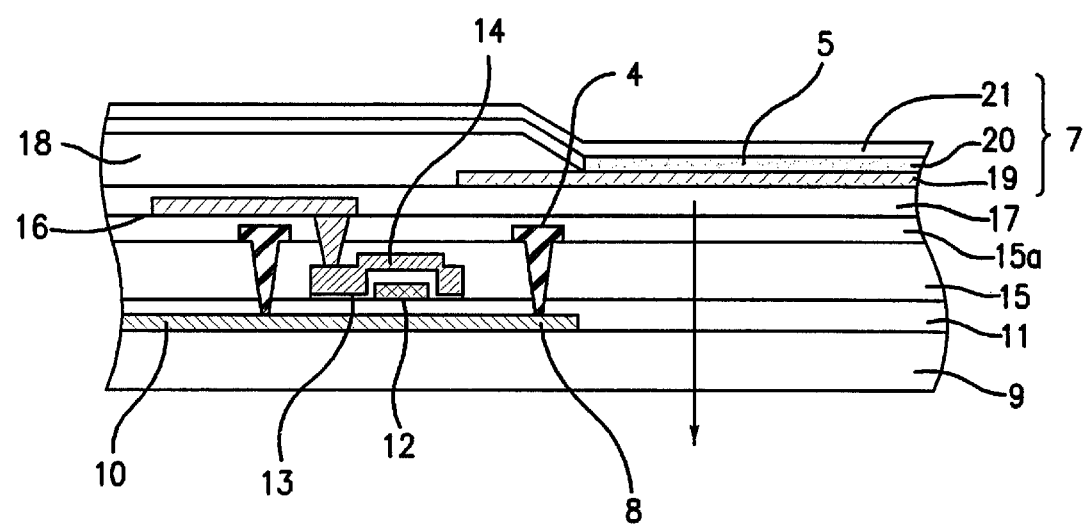
FIG. 8 is a fragmentary cross sectional elevation view illustrative of a single pixel of an active matrix organic electroluminescence display device, taken along a B–B' line of FIG. 7.

A second embodiment according to the present invention will be described in detail with reference to the drawings. FIG. 7 is a fragmentary enlarged plan view illustrative of a connecting portion between a thin film transistor and an indium tin oxide film in each pixel of an active matrix organic electroluminescence display device in a second embodiment in accordance with the present invention. FIG. 8 is a fragmentary cross sectional elevation view illustrative of a single pixel of an active matrix organic electroluminescence display device, taken along a B–B' line of FIG. 7.

Each pixel is defined by row wirings 1 and column wirings 2. The pixel includes a circuit region and an organic EL device 7. The circuit region includes a thin film transistor 3 and a capacitor if any. A gate electrode 14 of the thin film transistor 3 is connected to the row wiring 1. One of source/drain terminals of the thin film transistor 3 is connected to the column wiring 2. Another of the source/drain terminals of the thin film transistor 3 is connected to an anode 19 of the organic EL device 7. A shielding wall 4 is provided around a thin film transistor 3, so that the shielding wall 4 encompasses the circuit region.

The active matrix organic EL display device may be fabricated as follows. A transparent substrate 9 is prepared. A shielding layer made of a shielding material such as WSi or a metal with a thickness of about 200 nanometers is deposited by a sputtering method over the transparent substrate 9. A resist pattern is then formed over the shielding layer by use of a lithography technique. The shielding layer is then selectively etched by using the resist pattern as a mask, thereby to form a bottom shielding layer 10 over the transparent substrate 9.

An insulating film 11 such as a silicon oxide film having a thickness of about 600 nanometers is then deposited by a CVD method over the bottom shielding layer 10 and the transparent substrate 9. An amorphous silicon film having a thickness of about 60 nanometers is then deposited by the CVD method over the insulating film 11. An impurity is then doped into the amorphous silicon film. A heat treatment such as a laser anneal is then carried out to make the amorphous silicon film into a polysilicon film. A resist pattern is then formed by a lithography technique over the insulting film 11. The polysilicon film is selectively etched by using the resist pattern as a mask to form a polysilicon layer 12 over a thin film transistor formation region.

An insulating film and a WSi film with a thickness of about 200 nanometers are sequentially deposited over the polysilicon layer 12. A resist pattern is then formed over the WSi film by a lithography technique. The insulating film and the WSi film are selectively etched by using the resist pattern as a mask, thereby to form a gate insulating film 13 and a gate electrode 14. An impurity is doped into the gate electrode 14. As a result, a thin film transistor 3 is formed over the transparent substrate 9.

The drawing illustrates a single thin film transistor. Notwithstanding, it is possible if any, that a plurality of the thin film transistor 3 and capacitor may also be formed over the transparent substrate 9.

An inter-layer insulator 15 such as a silicon oxide film is deposited by a CVD method over the thin film transistor 3 and the insulating film 11. A shielding layer contact hole is formed in the inter-layer insulator 15 and the insulating film 11, so that shielding layer contact hole is positioned over the bottom shielding layer 10. The shielding layer contact hole extends, in a plan view, to form a square shaped trench groove which surrounds the thin film transistor 3.

An electrically conductive and optically shielding material such as aluminum is deposited by a sputtering method, so that the electrically conductive and optically shielding material is filled within the shielding layer contact hole as well as extends over the inter-layer insulator 15. The electrically conductive and optically shielding material as deposited is in contact with connecting portions 8 of the bottom shielding layer 10.

A resist pattern is formed by a lithography technique over the electrically conductive and optically shielding material. The electrically conductive and optically shielding material is then selectively etched by using the resist pattern as a mask, thereby to form an optically shielding wall 4. The optically shielding wall 4 encompasses the thin film transistor 3. The optically shielding wall 4 is connected with the connecting portions 8 of the bottom shielding layer 10, wherein the connecting portions 8 are around the thin film transistor in a plan view.

The optically shielding wall 4 vertically extends and the bottom shielding layer 10 horizontally extends. The optically shielding wall 4 is provided for isolating the thin film transistor 3 from the luminescence region 5. The optically shielding wall 4 is higher than the thin film transistor 3 for shielding the thin film transistor 3 from a stray light which has been transmitted from the organic EL device. The bottom shielding layer 10 extends under the thin film transistor 3 for shielding the thin film transistor 3 from a stray light which has been reflected at an interface of the transparent substrate 9. The combination of the optically shielding wall 4 with the bottom shielding layer 10 forms a three-dimensional optical shielding structure which shields the thin film transistor 3 from any stray lights.

Further, the optically shielding wall 4 is provided along an entirety of the circumference of the thin film transistor 3 in order to obtain a high shielding efficiency. It is also possible to modify the optically shielding wall 4, so that the optically shielding wall 4 partially extends along a stray light significant part of the circumference of the thin film transistor 3.

An additional inter-layer insulator 15a is also deposited by a CVD method over the inter-layer insulator 15 and the top of the optically shielding wall 4. Contact holes are formed in the additional inter-layer isnulator 15a and the inter-layer insulator 15. A wiring material such as aluminum is deposited by a sputtering method so that the wiring material fills the contact holes and extends over the additional inter-layer insulator 15a. A resist pattern is formed by using a lithography technique over the deposited wiring material. The deposited wiring material is selectively etched by using the resist pattern as a mask to form wirings 16.

A planarized insulating layer 17 comprising laminations of an organic film, a silicon oxide film and a nitride film is then deposited over the wirings 16 and the optically shielding wall 4 as well as over the additional inter-layer insulator 15a. A contact hole is formed in the planarized insulating layer 17 so that the contact hole is positioned over a part of the source and drain contacts.

An indium thin oxide film of a thickness of about 150 nanometers is deposited over the planarized insulating layer 17 and also within the contact hole, so that the indium thin oxide film within the contact hole is in contact with the part of the source and drain contacts. A resist pattern is formed over the indium thin oxide film by a lithography technique. The indium thin oxide film is selectively etched by using the resist pattern as a mask, thereby forming an anode 19 on a predetermined region. The anode 19 covers the opening of the bottom shielding layer 10. The anode 19 extends on the luminscence region 5. The anode 19 may be made of an electrically conductive and optically transparent material such as indium thin oxide or SnO2.

A resist layer 18 is formed over the planarized insulating layer 17 and a peripheral region of the anode 19. The resist layer 18 has an opening which is positioned inside of the circumference of the anode 19 and also inside of a region defined by the optically shielding wall 4. The opening of the resist layer 18 defines the luminescence region 5. Namely, the optically shielding wall 4 encompasses the opening of the resist layer 18 defining the luminescence region 5. The circumference of the anode 19 encompasses the region defined by the optically shielding wall 4. The optically shielding wall 4 isolates the luminescence region 5 from the thin film transistor 3. The resist layer 18 has a tapered sectioned shape adjacent to the opening, wherein the resist layer 18 gradually decreases in thickness toward the opening.

A luminescence device layered structure 20 is evaporated over the resist layer 18 and over the anode 19 exposed through the opening of the resist layer 18. The luminescence device layered structure 20 comprises laminations of a hole injection layer, a hole transport layer, a luminescent layer and an electron transport layer. Those layers are in the range of thickness from 10 nanometers to 50 nanometers. As a modification, it is possible that the luminescence device layered structure 20 comprises laminations of a hole transport layer, a luminescent layer and an electron transport layer. As another modification, it is also possible that the luminescent device layered structure 20 comprises laminations of a hole transport layer, a luminescent layer, an electron transport layer and an electron injection layer. As still another modification, it is also possible that the luminescence device layered structure 20 comprises a single layered structure of a luminescent layer. If a matrix color display is required, the luminescent layer is different in material for respective pixels.

A cathode 21 is evaporated over the luminescence device layered structure 20. The cathode 21 may have a thickness of about 200 nanometers. Aluminum, magnesium-indium alloy, aluminum-lithium alloy are available for the material of the cathode 21. As a result, the pixel of the organic EL display device is completed.

The active matrix organic EL display device also includes a power and a peripheral circuit which are not illustrated in the drawings. The active matrix organic EL display device also includes a sealing structure and a supporting structure which are not illustrated in the drawings.

In this embodiment, the wirings 16 serving as the row wirings 1 and the column wirings 2 are provided at a single level, so that the crossing point between the row wirings 1 and the column wirings 2 has a bridge structure which utilises the WSi layer which has been formed at the same time when the gate electrode has been formed. It is, however, possible as a modification that the row wirings 1 and the column wirings 2 are formed at different levels, wherein the wirings 16 comprise multi-level wirings.

The luminescence device layered structure 20 exhibits a luminescence but only in a region applied with an electrical field. The resist layer 18 prevents the luminescence device layered structure 20 from being applied with the electric field. The luminescence device layered structure 20 existing in the opening of the resist layer 18 is sandwiched between the anode 19 and the cathode 21 and applied with the electric field. The luminescence device layered structure 20, existing in the opening of the resist layer 18, exhibits a luminescence. This luminescence is omnidirectional.

As described above, the optically shielding wall 4 is provided for isolating the thin film transistor 3 from the luminescence region 5. The optically shielding wall 4 vertically extends from the same level as the bottom shielding layer 10 to a higher level than the top of the thin film transistor 3. Namely, the optically shielding wall 4 vertically extends from a lower level than the bottom of the thin film transistor 3 and a higher level than the top of the thin film transistor 3. Further, the bottom shielding layer 10 extends under the thin film transistor 3. The combination of the optically shielding wall 4 with the bottom shielding layer 10 shields the circuit region including the thin film transistor 3 from any stray lights which have been scattered in the substrate 9, the insulating layer 11 and the inter-layer insulator 15 or reflected by interfaces between them or reflected from the substrate 9. As a result, the circuit including the thin film transistor 3 is free from any malfunction due to the stray light. The active matrix organic EL device is free from any defective device.

In the above embodiment, the optically shielding wall 4 is provided along the circumference of the thin film transistor 3 in order to obtain a high shielding efficiency. It is also possible to modify the optically shielding wall 4, so that the optically shielding wall 4 partially extends along a stray light significant part of the circumference of the thin film transistor 3.

It is, however, possible as a modification that the optically shielding wall 4 is made of a different optically shielding material from the source and drain contacts 16a and the wirings 16. Metals or organic materials having optically shielding functions may be available for the optically shielding wall 4. Organic materials containing coloring materials are available.

The sectional shape of the optically shielding wall 4 is illustrated as becoming narrower downwardly because the shielding layer contact holes are slightly tapered downwardly due to etching conditions. The tapered sectional shape of the optically shielding wall 4 is thus optional, provided that the narrowest portion of the optically shielding wall 4 is sufficient for shielding the stray light.

Further, it is also possible to modify the optically shielding wall 4, so that the optically shielding wall 4 is provided along the circumference of the thin film transistor 3 except for the wiring 16, so that the top of the optically shielding wall 4 lies the same level as the wiring 16, and the optically shielding wall 4 may be formed at the same process for forming the gate contact and the wiring layer 16.

There is no restriction or limitation to the relation in position between the anode 19 and the optically shielding wall 4, except adjacent to the thin film transistor 3. This allows a large freedom in design to the pixel structure.

Further, the above structure is suitable for ensuring a larger ratio in area of a luminescence region to a pixel region as compared to the first embodiment.

THIRD EMBODIMENT

Figure 9:
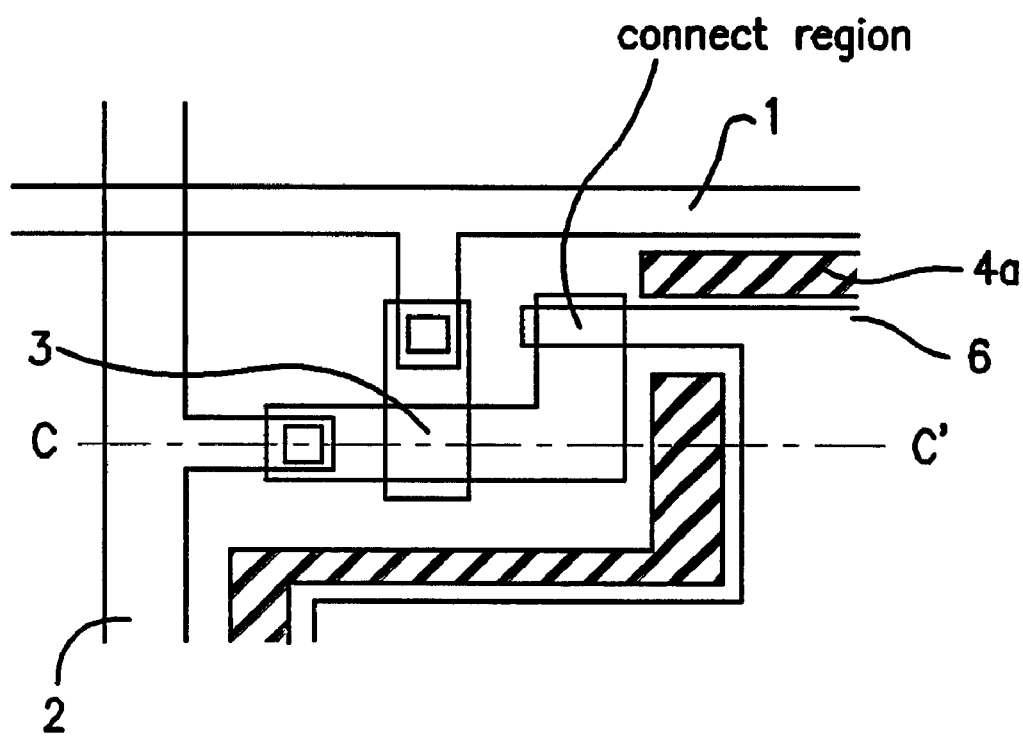
FIG. 9 is a fragmentary enlarged plan view illustrative of a connecting portion between a thin film transistor and an indium tin oxide film in each pixel of an active matrix organic electroluminescence display device in a third embodiment in accordance with the present invention.
Figure 10:
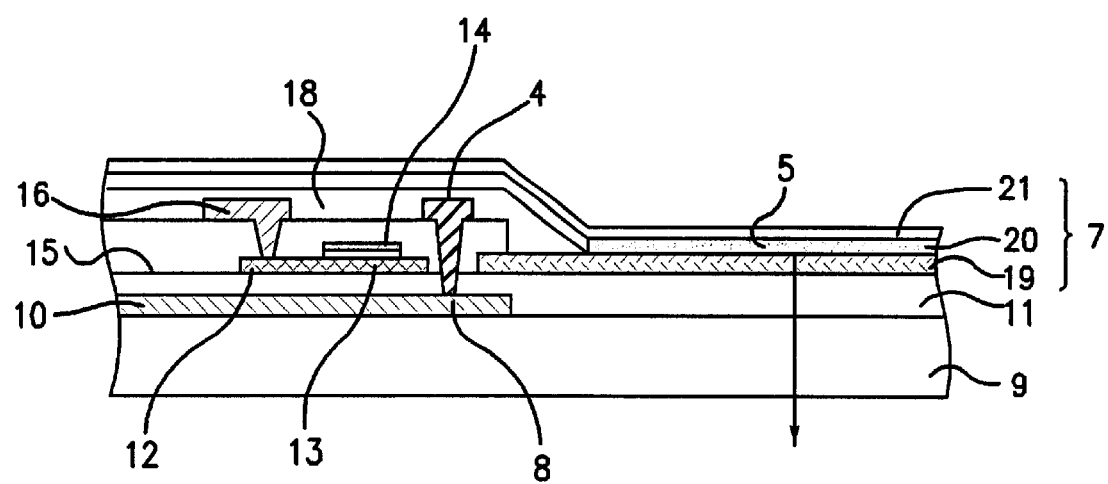
FIG. 10 is a fragmentary cross sectional elevation view illustrative of a single pixel of an active matrix organic electroluminescence display device, taken along a C–C' line of FIG. 9.

A third embodiment according to the present invention will be described in detail with reference to the drawings. FIG. 9 is a fragmentary enlarged plan view illustrative to a connecting portion between a thin film transistor and an indium tin oxide film in each pixel of an active matrix organic electroluminescence display device in a third embodiment in accordance with the present invention. FIG. 10 is a fragmentary cross sectional elevation view illustrative of a single pixel of an active matrix organic electroluminescence display device, taken along a C-C' line of FIG. 9.

Each pixel is defined by row wirings 1 and column wirings 2. The pixel includes a circuit region and an organic EL device 7. The circuit region includes a thin film transistor 3 and a capacitor if any. A gate electrode 14 of the thin film transistor 3 is connected to the row wiring 1. One of source/drain terminals of the thin film transistor 3 is connected to the column wiring 2. Another of the source/drain terminals of the thin film transistor 3 is connected to an anode 19 of the organic EL device 7. A shielding wall 4 is provided along a circumference of a luminescence region 5, so that the shielding wall 4 encompasses the luminescence region 5, and the shielding wall 4 also surrounds the anode 19. The top level of the shielding wall 4 is higher than the anode 19 and the luminescence region 5.

The active matrix organic EL display device may be fabricated as follows. A transparent substrate 9 is prepared. A shielding layer made of a shielding material such as WSi or a metal with a thickness of about 200 nanometers is deposited by a sputtering method over the transparent substrate 9. A resist pattern is then formed over the shielding layer by use of a lithography technique. The shielding layer is then selectively etched by using the resist pattern as a mask, thereby to form a bottom shielding layer 10 over the transparent substrate 9.

An insulating film 11 such as a silicon oxide film having a thickness of about 600 nanometers is then deposited by a CVD method over the bottom shielding layer 10 and the transparent substrate 9. An amorphous silicon film having a thickness of about 60 nanometers is then deposited by the CVD method over the insulating film 11. An impurity is then doped into the amorphous silicon film. A heat treatment such as a layer anneal is then carried out to make the amorphous silicon film into a polysilicon film. A resist pattern is then formed by a lithography technique over the insulating film 11. The polysilicon film is selectively etched by using the resist pattern as a mask to form a polysilicon layer 12 over a thin film transistor formation region.

An insulating film and a WSi film with a thickness of about 200 nanometers are sequentially deposited over the polysilicon layer 12. A resist pattern is then formed over the WSi film by a lithography technique. The insulating film and the WSi film are selectively etched by using the resist pattern as a mask, thereby to form a gate insulating film 13 and a gate electrode 14. An impurity is doped into the gate electrode 14 and selected regions of the polysilicon layer 12. As a result, a thin film transistor 3 is formed over the transparent substrate 9.

The drawing illustrates a single thin film transistor. Notwithstanding, it is possible, if any, that a plurality of the thin film transistor 3 and capacitor may also be formed over the transparent substrate 9.

An anode 19 of an indium thin oxide film is selectively formed over the insulating layer 11, so that a part of the anode 19 is in contact with a part of the polysilicon layer 12. The anode 19 covers the opening of the bottom shielding layer 10. The anode 19 extends on the luminescence region 5. The anode 19 may be made of an electrically conductive and optically transparent material such as indium thin oxide or SnO2. The anode 19 and the polysilicon layer 11 overly the insulating layer 11.

An inter-layer insulator 15 such as a silicon oxide film is deposited by a CVD method over the thin film transistor 3 and the insulating film 11 as well as a part of the anode 19. Source/drain contact holes are formed in the inter-layer insulator 15, so that the contact holes are positioned in source/drain contact regions. Further, a shielding layer contact hole is formed in the inter-layer insulator 15 and the insulating film 11, so that shielding layer contact hole is positioned over a peripheral region of the bottom shielding layer 10. The shielding layer contact hole extends, in a plan view, to form a trench groove which surrounds the opening of the bottom shielding layer 10.

An electrically conductive and optically shielding material such as aluminum is deposited by a sputtering method, so that the electrically conductive and optically shielding material is filled within the source/drain contact holes and shielding layer contact holes as well as extends over the inter-layer insulator 15. The electrically conductive and optically shielding material as deposited is in contact with the source and drain of the thin film transistor 3 and connecting portions 8 of the bottom shielding layer 10.

A resist pattern is formed by a lithograhy technique over the electrically conductive and optically shielding material. The electrically conductive and optically shielding material is then selectively etched by using the resist pattern as a mask, thereby to form wirings 16, source and drain contacts 16*a* and an optically shielding wall 4. The optically shielding wall 4 encompasses the anode 19. The optically shielding wall 4 is connected with the connecting portions 8 of the bottom shielding layer 10, wherein the connecting portions 8 are adjacent to an opening region of the bottom shielding layer 10. The opening region of the bottom shielding layer 10 encompasses the luminescence region 5.

The optically shielding wall 4 vertically extends and the bottom shielding layer 10 horizontally extends. The optically shielding wall 4 is provided for isolating the thin film transistor 3 from the luminescence region 5. The optically shielding wall 4 vertically extends from a lower level that the thin film transistor 3 and the anode 19 to a higher level than the thin film transistor 3 and the anode 19 for shielding the thin film transistor 3 from a stray light which has been propagated through the anode 19 made of indium tin oxide. The bottom shielding layer 10 extends under the thin film transistor 3 for shielding the thin film transistor 3 from a stray light which has been reflected at an interface of the transparent substrate 9. The combination of the optically shielding wall 4 with the bottom shielding layer 10 forms a three-dimensional optical shielding structure which shields the thin film transistor 3 from any stray lights.

Further, the optically shielding wall 4 is provided along an entirety of the circumference of the luminescence region 5 in order to obtain a high shielding efficiency. It is also possible to modify the optically shielding wall 4, so that the optically shielding wall 4 partially extends along a stray light significant part of the circumference of the luminescence region 5.

A resist layer 18 is formed over the inner-layer insulator 15 and a peripheral region of the anode 19. The resist layer 18 has an opening which is positioned inside of the circumference of the anode 19 and also inside of a region defined by the optically shielding wall 4. The opening of the resist layer 18 defines the luminescence region 5. Namely, the optically shielding wall 4 encompasses the opening of the resist layer 18 defining the luminescence region 5. The region defined by the optically shielding wall 4 encompasses the circumference of the anode 19. The optically shielding wall 4 isolates the luminescence region 5 from the thin film transistor 3. The resist layer 18 has a tapered sectioned shape adjacent to the opening, wherein the resist layer 18 gradually decreases in thickness toward the opening.

A luminescence device layered structure 20 is evaporated over the resist layer 18 and over the anode 19 exposed through the opening of the resist layer 18. The luminescence device layered structure 20 comprises laminations of a hole injection layer, a hole transparent layer, a luminescence layer and an electron transport layer. Those layers are in the range of thickness from 10 nanometers to 50 nanometers. As a modification, it is possible that the luminescence device layered structure 20 comprises laminations of a hole transport layer, a luminescent layer and an electron transport layer. As another modification, it is also possible that the luminescence device layered structure 20 comprises laminations of a hole transport layer, a luminescent layer, an electron transport layer and an electron injection layer. As still another modification, it is also possible that the luminescence device layered structure 20 comprises a single layered structure of a luminescent layer. If a matrix color display is required, the luminescent layer is different in material for respective pixels.

A cathode 21 is evaporated over the luminescence device layered structure 20. The cathode 21 may have a thickness of about 200 nanometers. Aluminum, magnesium-indium alloy, aluminum-lithium alloy are available for the material of the cathode 21. As a result, the pixel of the organic EL display device is completed.

The active matrix organic EL display device also includes a power and a peripheral circuit which are not illustrated in the drawings. The active matrix organic EL display device also includes a sealing structure and a supporting structure which are not illustrated in the drawings.

In this embodiment, the wirings 16 serving as the row wirings 1 and the column wirings 2 are provided at a single level, so that the crossing point between the row wirings 1 and the column wirings 2 has a bridge structure which utilizes the WSi layer which has been formed at the same time when the gate electrode has been formed. It is, however, possible as a modification that the row wirings 1 and the column wirings 2 are formed at different levels, wherein the wirings 16 comprise multi-level wirings.

The luminescence device layered structure 20 exhibits a luminescence but only in a region applied with an electric field. The resist layer 18 prevents the luminescence device layered structure 20 from being applied with the electric field. The luminescence device layered structure 20 existing in the opening of the resist layer 18 is sandwiched between the anode 19 and the cathode 21 and applied with the electric field. The luminescence device layered structure 20, existing in the opening of the resist layer 18, exhibits a luminescence. This luminescence is omnidirectional.

As described above, the optically shielding wall 4 is provided for isolating the thin film transistor 3 from the luminescence region 5. The optically shielding wall 4 vertically extends from the same level as the bottom shielding layer 10 to the same level as the wirings 16. Namely, the optically shielding wall 4 vertically extends from a lower level than the bottom of the thin film transistor 3 and a higher level than the top of the thin film transistor 3. Further, the bottom shielding layer 10 extends under the thin film transistor 3. The combination of the optically shielding wall 4 with the bottom shielding layer 10 shields the circuit region including the thin film transistor 3 from any stray lights which have been scattered in the substrate 9, the insulating layer 11 and the inter-layer insulator 15 or reflected by interfaces between them or reflected from the substrate 9. As a result, the circuit including the thin film transistor 3 is free from any malfunction due to the stray light. The active matrix organic EL device is free from any defective display.

In the above embodiment, the optically shielding wall 4 is provided along the entirety of the circumference of the luminescence region 5 in order to obtain a high shielding efficiency. It is also possible to modify the optically shielding wall 4, so that the optically shielding wall 4 partially extends along a stray light significant part of the circumference of the luminescence region 5.

In the above embodiment, the optically shielding wall 4 is formed at the same process for forming the source and drain contacts 16*a* and the wirings 16, provided that the optically shielding wall 4 is made of the same material as the source and drain contacts 16a and the wirings 16. No additional process is needed for forming the optically shielding wall 4.

It is, however, possible as a modification that the optically shielding wall 4 is made of a different optically shielding material from the source and drain contacts 16a and the wirings 16. Metals or organic materials having optically shielding functions may be available for the optically shielding wall 4. Organic materials containing coloring materials are available.

The sectional shape of the optically shielding wall 4 is illustrated as becoming narrower downwardly because the shielding layer contact hole is slightly tapered downwardly due to etching conditions. The tapered sectional shape of the optically shielding wall 4 is thus optional, provided that the narrowest portion of the optically shielding wall 4 is sufficient for shielding the stray light.

Although the invention has been described above in connection with several preferred embodiments therefor, it will be appreciated that those embodiments have been provided solely for illustrating the invention, and not in a limiting sense. Numerous modifications and substitutions of equivalent materials and techniques will be readily apparent to those skilled in the art after reading the present application, and all such modifications and substitutions are expressly understood to fall within the true scope and spirit of the appended claims.

What is claimed is:

1. A pixel structure of an electroluminescence display device, said structure including:
   a luminescent region which exhibits a luminescence upon application of an electric field;
   a circuitry region including at least a circuitry; and
   an optical shielding structure provided between said luminescent region and said circuitry region shielding said circuitry region from said luminescence emitted from said luminescent region,
   wherein said optical shielding structure includes a shielding wall which vertically extends from a lower level than a circuitry of said circuitry region to a higher level than said circuitry.

2. The pixel structure as claimed in claim 1, wherein said optical shielding structure further includes a shielding layer which horizontally extends under said circuitry region.

3. The pixel structure as claimed in claim 2, wherein said shielding wall vertically extends from a part of an upper surface of said optical shielding structure, and a bottom of said shielding wall is in contact with said part of said upper surface of said optical shielding structure.

4. The pixel structure as claimed in claim 1, wherein said shielding wall partially surrounds said luminescent region in a plan view.

5. The pixel structure as claimed in claim 1, wherein said shielding wall completely surrounds said luminescent region in a plan view.

6. The pixel structure as claimed in claim 1, wherein said shielding wall partially surrounds said circuitry in a plan view.

7. The pixel structure as claimed in claim 1, wherein said shielding wall completely surrounds said circuitry in a plan view.

8. The pixel structure as claimed in claim 1, wherein said shielding wall has a top level which is substantially the same as a wiring layer which is electrically connected to said circuitry.

9. The pixel structure as claimed in claim 1, wherein said shielding wall has a top level which is lower than an anode layer of said luminescent region.

10. The pixel structure as claimed in claim 1, wherein said shielding wall has a top level which is higher than an anode layer of said luminescent region, and a bottom level which is lower than said anode layer.

11. The pixel structure as claimed in claim 1, wherein said shielding wall is made of a same material as a wiring layer which is electrically connected to said circuitry.

12. The pixel structure as claimed in claim 1, wherein said circuitry comprises a thin film transistor.

13. An active matrix organic electroluminescence display device including:
    a transparent substrate;
    a plurality of pixels aligned over said transparent substrate, each of said pixels further including:
    a luminescent region which exhibits a luminescence upon application of an electric field;
    a circuitry region including at least a circuitry; and
    an optical shielding structure provided between said luminescent region and said circuitry region shielding said circuitry region from said luminescence emitted from said luminescent region,
    wherein said optical shielding structure includes a shielding wall which vertically extends from a lower level than a circuitry of said circuitry region to a higher level than said circuitry.

14. The active matrix organic electroluminescence display device as claimed in claim 13, wherein said optical shielding structure further includes a shielding layer which horizontally extends under said circuitry region.

15. The active matrix organic electroluminescence display device as claimed in claim 13, wherein said circuitry comprises a thin film transistor.

16. The active matrix organic electroluminescence display device as claimed in claim 14, wherein said shielding wall vertically extends from a part of an upper surface of said optical shielding structure, and a bottom of said shielding wall is in contact with said part of said upper surface of said optical shielding structure.

17. The active matrix organic electroluminescence display device as claimed in claim 14, wherein said shielding wall partially surrounds said luminescent region in a plan view.

18. The active matrix organic electroluminescence display device as claimed in claim 14, wherein said shielding wall completely surrounds said luminescent region in a plan view.

19. The active matrix organic electroluminescence display device as claimed in claim 14, wherein said shielding wall partially surrounds said circuitry in a plan view.

20. The active matrix organic electroluminescence display device as claimed in claim 14, wherein said shielding wall completely surrounds said circuitry in a plan view.

21. The active matrix organic electroluminescence display device as claimed in claim 14, wherein said shielding wall has a top level which is substantially the same as a wiring layer which is electrically connected to said circuitry.

22. The active matrix organic electroluminescence display device as claimed in claim 14, wherein said shielding wall has a top level which is lower than an anode layer of said luminescent region.

23. The active matrix organic electroluminescence display device as claimed in claim 14, wherein said shielding wall has a top level which is higher than an anode layer of said luminescent region, and a bottom level which is lower than said anode layer.

24. The active matrix organic electroluminescence display device as claimed in claim 14, wherein said shielding wall is made of a same material as a wiring layer which is electrically connected to said circuitry.

25. A method of forming an optical shielding structure between a luminescent region and a circuitry region in a pixel of an electroluminescence display device shielding said circuitry region from a luminescence emitted from said luminescent region, said method comprising the steps of:

selecting forming an optical shielding layer over a substrate on said circuitry region;

forming a first insulating layer over said optical shielding layer and said substrate;

forming a circuitry over said first insulating layer on said circuitry region;

forming a second insulating layer over said circuitry and said first insulating layer;

forming at least a first contact hole, which penetrates said second insulating layer and reaches a part of said circuitry, and at least a second contact hole, which penetrates said first and second insulating layers and reaches a part of said optical shielding layer;

selectively forming at least a wiring layer electrically connected through said at least first contact hole to said circuitry and also at least an optical shielding wall within said at least second contact hole, wherein said optical shielding wall is in contact with said optical shielding layer.

26. The method as claimed in claim 25, wherein said step of forming at least a wiring layer further comprises the steps of:

depositing an electrically conductive and optically shielding material over said second insulating layer and also within said at least first contact hole and said at least second contact hole; and selectively removing said electrically conductive and optically shielding material to form at least a wiring layer electrically connected to said circuitry and also at least an optical shielding wall in contact with said optical shielding layer.

27. The method as claimed in claim 25, wherein said at least second contact hole partially surrounds said luminescent region in a plan view.

28. The method as claimed in claim 25, wherein said at least second contact hole completely surrounds said luminescent region in a plan view.

29. The method as claimed in claim 25, wherein said at least second contact hole partially surrounds said circuitry in a plan view.

30. The method as claimed in claim 29, wherein said at least first contact hole completely surrounds said circuitry in a plan view.

31. The method as claimed in claim 29, wherein said at least second contact hole completely surrounds said circuitry in a plan view.

32. A method of forming an optical shielding structure between a luminescent region and a circuitry region in a pixel of an electroluminescence display device shielding said circuitry region from a luminescence emitted from said luminescent region, said method comprising the steps of:

selectively forming an optical shielding layer over a substrate on said circuitry region;

forming a first insulating layer over said optical shielding layer and said substrate;

forming a circuitry over said first insulating layer on said circuitry region;

forming a second insulating layer over said circuitry and said first insulating layer;

forming at least a first contact hole, which penetrates said first and second insulating layers and reaches a part of said optical shielding layer;

selecting forming at least an optical shielding wall within said at least first contact hole, wherein said optical shielding wall is in contact with said optical shielding layer;

forming a third insulating layer over said at least optical shielding wall and said second insulating layer;

forming at least a second contact hole, which penetrates said second and third insulating layer and reaches a part of said circuitry; and selectively forming at least a wiring layer electrically connected through said at least second contact hole to said circuitry.

33. The method as claimed in claim 32, wherein said at least first contact hole partially surrounds said luminescent region in a plan view.

34. The method as claimed in claim 32, wherein said at least first contact hole completely surrounds said luminescent region in a plan view.

35. The method as claimed in claim 32, wherein said at least first contact hole partially surrounds said circuitry in a plan view.

* * * * *